United States Patent
Lin et al.

(10) Patent No.: US 8,854,167 B2
(45) Date of Patent: Oct. 7, 2014

(54) MAGNETIC ASSEMBLY

(75) Inventors: Ching Tzung Lin, Pingzhen (TW); Wen Cheng Yu, Pingzhen (TW); Ching Yuan Cheng, Pingzhen (TW)

(73) Assignee: Mag. Layers Scientific-Technics Co., Ltd., Hsinchu County (TW)

( * ) Notice: Subject to any disclaimer, the term of this patent is extended or adjusted under 35 U.S.C. 154(b) by 88 days.

(21) Appl. No.: 13/402,467

(22) Filed: Feb. 22, 2012

(65) Prior Publication Data

US 2013/0215580 A1    Aug. 22, 2013

(51) Int. Cl.
*H01F 27/02*   (2006.01)
*H01F 5/00*    (2006.01)
*H01F 27/28*   (2006.01)

(52) U.S. Cl.
USPC ............... 336/96; 336/83; 336/90; 336/92; 336/200; 336/229; 336/232

(58) Field of Classification Search
USPC ............... 336/200, 229, 232, 83, 90, 92, 96
See application file for complete search history.

(56) References Cited

U.S. PATENT DOCUMENTS

| | | | |
|---|---|---|---|
| 3,483,497 A * | 12/1969 | Kendall et al. | 336/96 |
| 5,430,613 A * | 7/1995 | Hastings et al. | 361/760 |
| 7,326,084 B1 * | 2/2008 | Chen et al. | 439/620.23 |
| 2006/0284717 A1 * | 12/2006 | Iverson et al. | 336/200 |
| 2009/0273908 A1 * | 11/2009 | Tsao et al. | 361/748 |
| 2010/0026438 A1 * | 2/2010 | Gilmartin et al. | 336/192 |
| 2011/0140823 A1 * | 6/2011 | Lin et al. | 336/90 |

FOREIGN PATENT DOCUMENTS

TW    M408104    7/2011

* cited by examiner

*Primary Examiner* — Tszfung Chan
(74) *Attorney, Agent, or Firm* — Muncy, Geissler, Olds & Lowe, P.C.

(57) ABSTRACT

A magnetic assembly is formed by a Printed Circuit Board (PCB) and a cover. A plurality of magnetic elements is electrically disposed on the PCB, and the magnetic elements are connected to one another through an electric circuit on the PCB. An accommodation space is formed on the cover for receiving the magnetic elements. During the manufacturing of the magnetic assembly, a cover with an appropriate space is selected according to the size, quantity, and specification type of the magnetic elements. After the two components are assembled, adhesive is injected into the cover, so that the cover and the PCB are fixedly disposed, and the elements in the accommodation space are protected. Therefore, in a process of manufacturing the magnetic assembly, covers with different accommodation spaces are selected for collocation according to requirements of the assembled electrical elements.

7 Claims, 10 Drawing Sheets

MAGNETIC ASSEMBLY

BACKGROUND OF THE UTILITY MODEL

1. Field of the Utility Model

The utility model relates to a magnetic assembly, and more particularly to a magnetic assembly capable of selecting covers with different accommodation spaces for packaging according to a specification type of disposed magnetic elements, so as to adapt to different design specifications.

2. Related Art

A magnetic element such as a transformer, an inductor and an electromagnetic switch is widely used in various electronic devices, and produces required efficacy through a feature of generating a magnetic field through switching on. In addition, with the miniaturization trend of the electronic devices, the components and elements also need to be miniaturized. Therefore, the structure of the magnetic element is designed towards miniaturization without changing the functions thereof. For example, ROC Utility Model Patent No. M408104 entitled "Transformer Structure" discloses a transformer having a packaging construction, in which a winding frame 20 wound with a coil is packaged in an insulation casing 10 through magnetic adhesive 40, so as to implement a structure design capable of being manufactured conveniently. It can be inferred from the above patent that, the insulation casing 10 may also be properly adjusted according to the construction of the winding frame 20, but the original transformer structure is merely packaged through the insulation casing 10 after the completion of the packaging, so that the structure still merely has the transformer function. Moreover, in the current integration era, the transformer still occupies a large space of the electronic device. Therefore, if the magnetic assembly has the function of an integrated circuit, the space occupied by the magnetic element can be dramatically reduced, and the magnetic element further produces diversified effects after the packaging. Furthermore, the appearance structure of the current magnetic assembly is mostly set at a designing phase, causing that a single appearance specification is produced and is merely applied to a single magnetic assembly. If the specification of the magnetic assembly is changed or the inner magnetic element is changed, the appearance thereof needs to be re-designed to adapt to the change.

SUMMARY OF THE UTILITY MODEL

Accordingly, the inventor analyzes and researches a current structure of a magnetic assembly and a manufacturing method thereof based on the experience in the field of the magnetic assembly for many years, so as to design a structure capable of solving the above problems. Therefore, the utility model is mainly directed to a magnetic assembly capable of adjusting the construction of a packaging casing according to different specifications.

In order to achieve the above objective, the utility model provides a magnetic assembly, formed by a Printed Circuit Board (PCB) and a cover. A plurality of magnetic elements is disposed on the PCB, and the magnetic elements are connected to one another through an electric circuit on the PCB. An accommodation space is formed on the cover for receiving the magnetic elements after the assembly of the cover and the PCB. More than one injection portion is further formed on the cover for injection of adhesive, so that the two components are fixedly disposed. In addition, before the assembly, the cover can be selected according to the specification, quantity and size of the magnetic elements. In this way, an appropriate cover is selected according to an accommodation space required by the assembled magnetic elements in a process of manufacturing the magnetic assembly, thereby solving the problem that a packaging structure needs to be re-manufactured when the specification of the current magnetic assembly is changed.

The descriptions of the above content of the utility model and the following embodiment are intended to demonstrate and illustrate the spirit and principle of the utility model, and further illustrate the scope of the utility model.

DETAILED DESCRIPTION OF THE UTILITY MODEL

Figure 1:
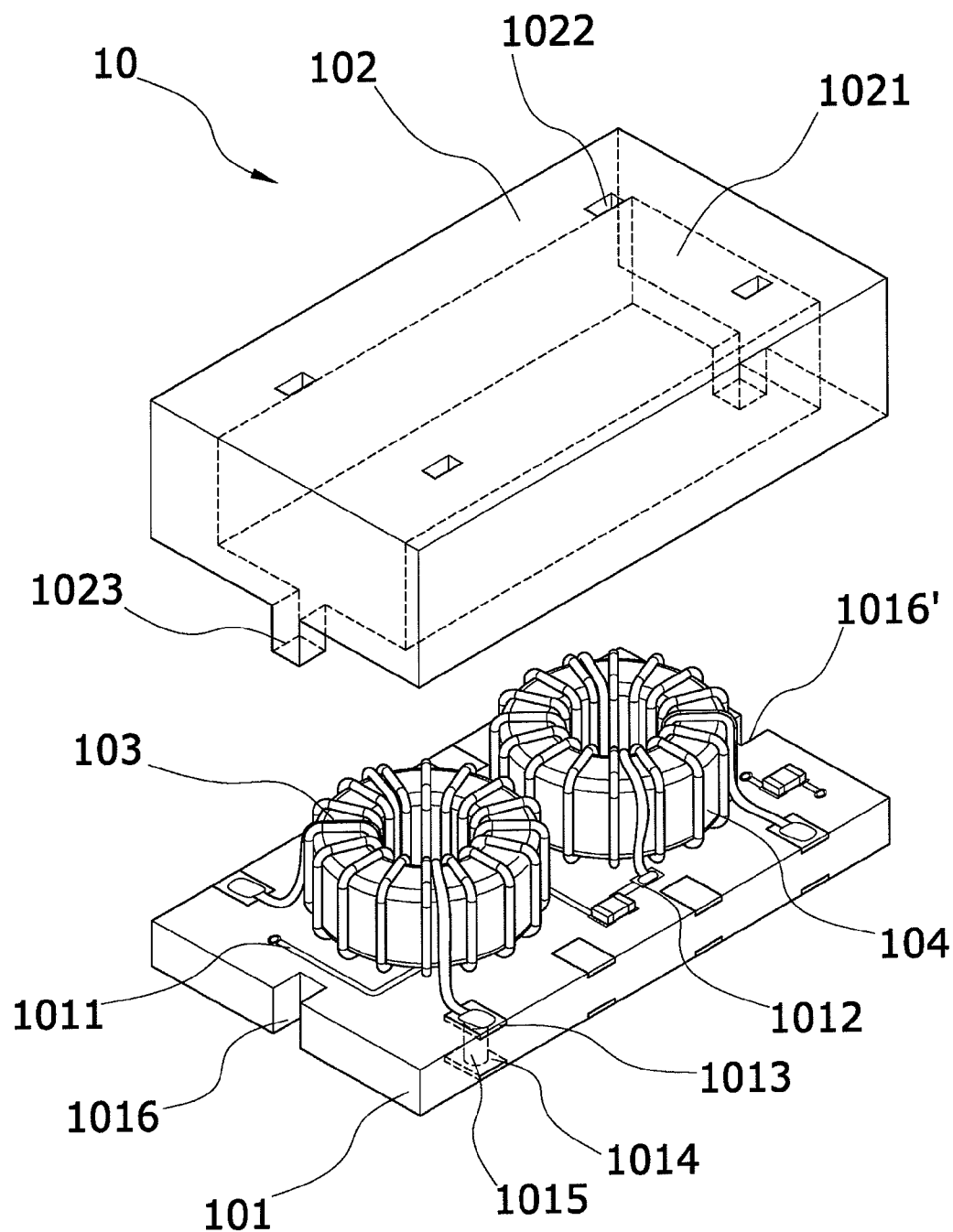
FIG. 1 is a schematic view of an assembly of the utility model.

FIG. 1 is a schematic view of an assembly of the utility model. Referring to FIG. 1, a magnetic assembly 10 of the utility model is formed by a PCB 101 and a cover 102. An electric circuit 1011 is disposed on the PCB 101, and more than one electrical joint 1012 is formed on the circuit, so that other electronic components can be disposed and connected thereon. End edges of the PCB 101 are respectively formed with a first conductive terminal 1013 and a second conductive terminal 1014, a through hole 1015 is formed between the two conductive terminals (1013, 1014), and a conductive material is filled in the through hole 1015, so that the two conductive terminals (1013, 1014) are electrically connected to each other. A plurality of magnetic elements is electrically disposed on the PCB 101, such as a first magnetic element 103 and a second magnetic element 104 in FIG. 1. Each of the magnetic elements (103 or 104) when disposed is respectively connected to the electric circuit 1011 or the first conductive terminal 1013. In this way, when the power is on, a required electrical feature may be produced. The PCB 101 may be further electrically disposed with a related electrical passive element or a related element such as a resistor or capacitor, in addition to the above described magnetic element (103 or 104). As shown in FIG. 1, an appearance of the cover 102 may be adjusted according to the specification and size of the PCB 101. An outer edge of the cover 102 is recessed and forms an accommodation space 1021, and another outer edge thereof is formed with a plurality of injection portions 1022. Each injection portion 1022 penetrates the cover 102, so as to be in communication with the accommodation space 1021. The construction of the accommodation space 1021 such as a depth thereof may be slightly adjusted according to the magnetic elements (103, 104) disposed on the PCB 101. Two opposite end edges of the PCB 101 are respectively formed with an assembling portion (1016, 1016'), and corresponding positions on the cover 102 are respectively formed with a relative assembling portion 1023. In this way, the two components (101, 102) are disposed in a limit manner through the two sets of assembling portions (1016, 1023).

Figure 2:
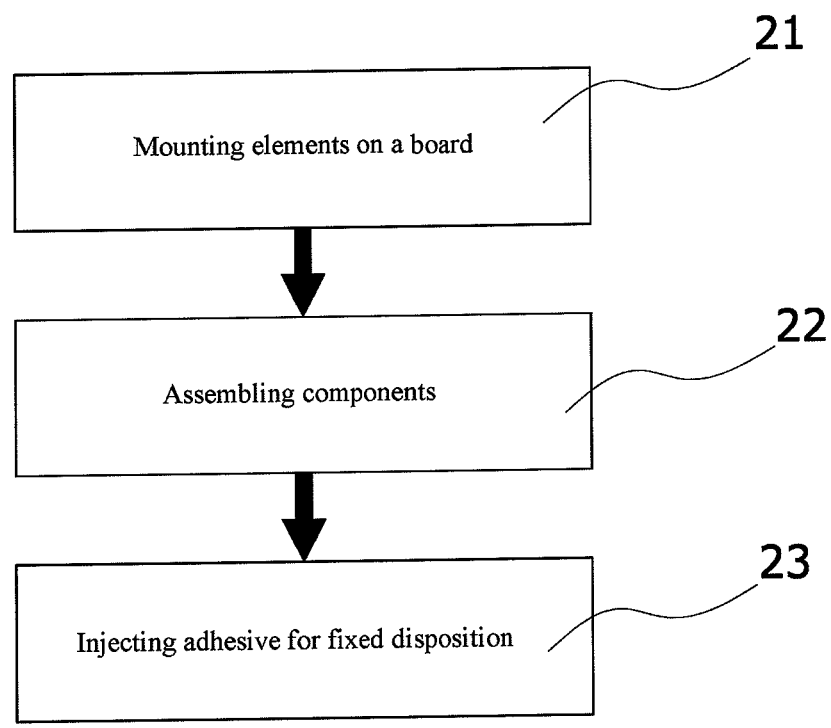
FIG. 2 is a schematic view of an implementation process of the utility model.

FIG. 2 is a schematic view of an implementation process of the utility model. As described above, a component assembling process of the magnetic assembly 10 is described in the following.

(1) Mounting elements on a board 21: At the beginning of the assembly, related components or the magnetic element (103 or 104) to be disposed on the PCB 101 are disposed on the PCB 101 one by one, and are respectively electrically connected to the electric circuit 1011, so as to produce an electrical characteristics required in the design when the power is on.

Figure 3:
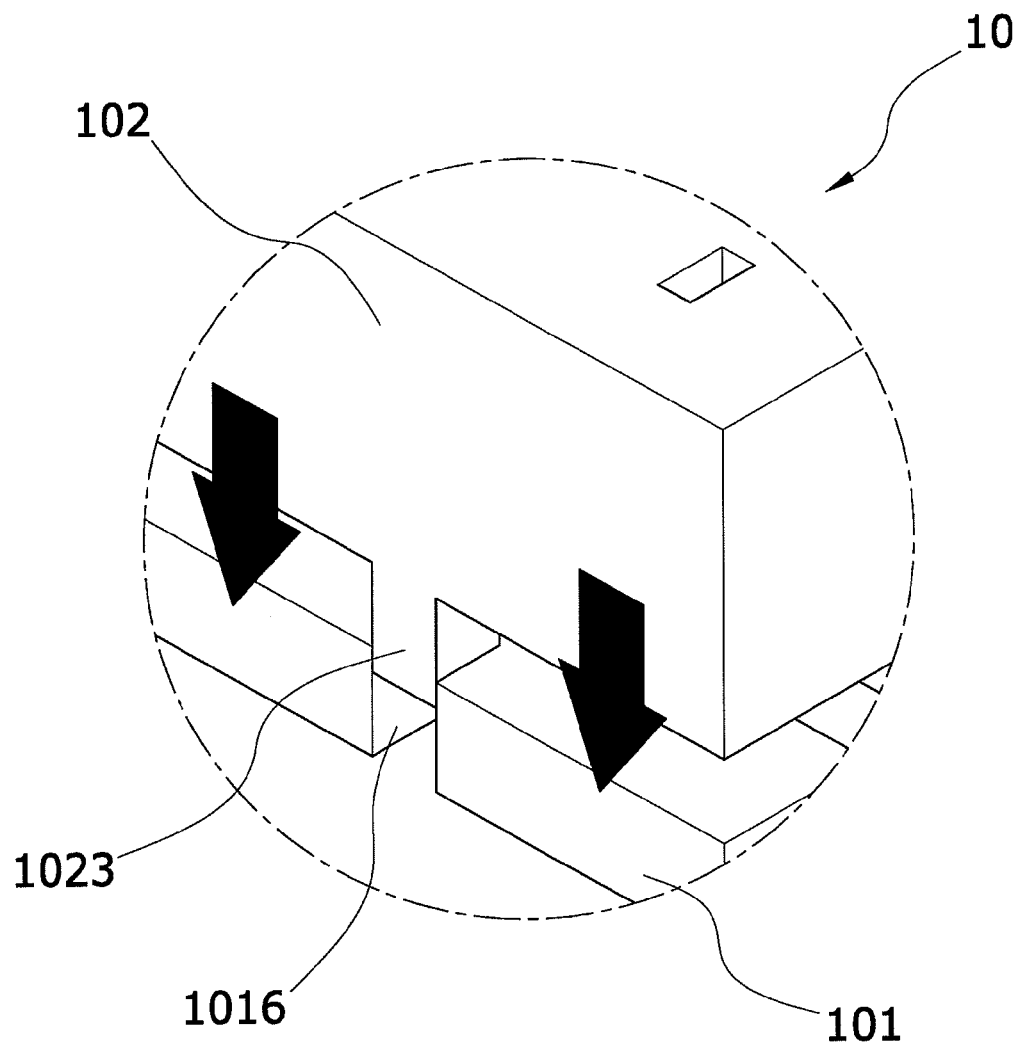
FIG. 3 is a schematic view (1) of implementation of the utility model.

(2) Assembling components 22: As described above, referring to FIG. 3, a schematic view (1) of implementation of the utility model is shown; after Step 21, the PCB 101 is assembled to the cover 102, and the relative assembling portion 1023 on the cover 102 is assembled to the assembling portion 1016 on the PCB 101, so that the two components (101, 102) are temporarily fixedly disposed.

Figure 4:
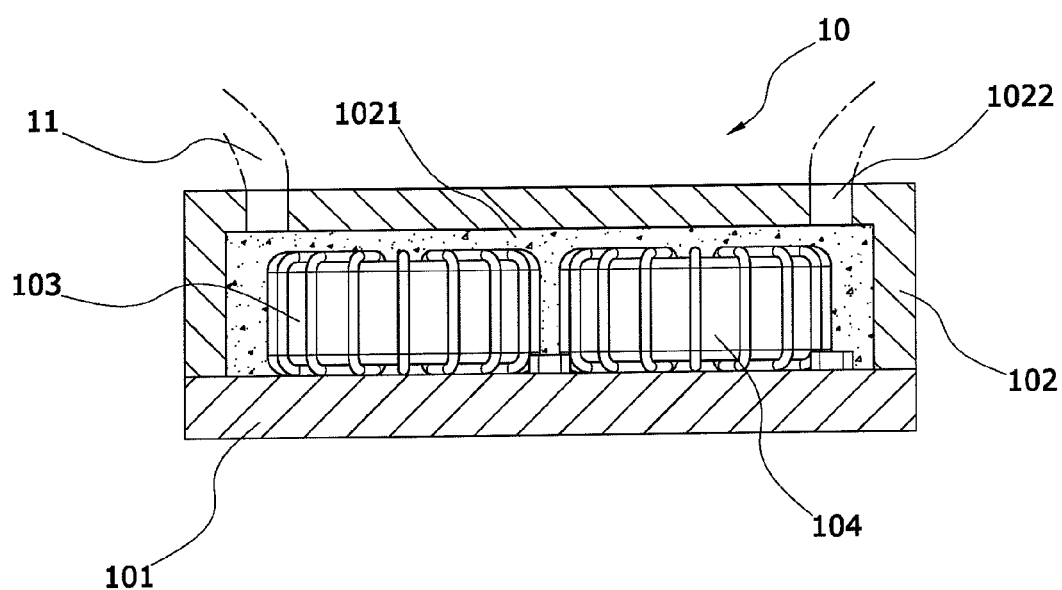
FIG. 4 is a schematic view (2) of implementation of the utility model.
Figure 5:
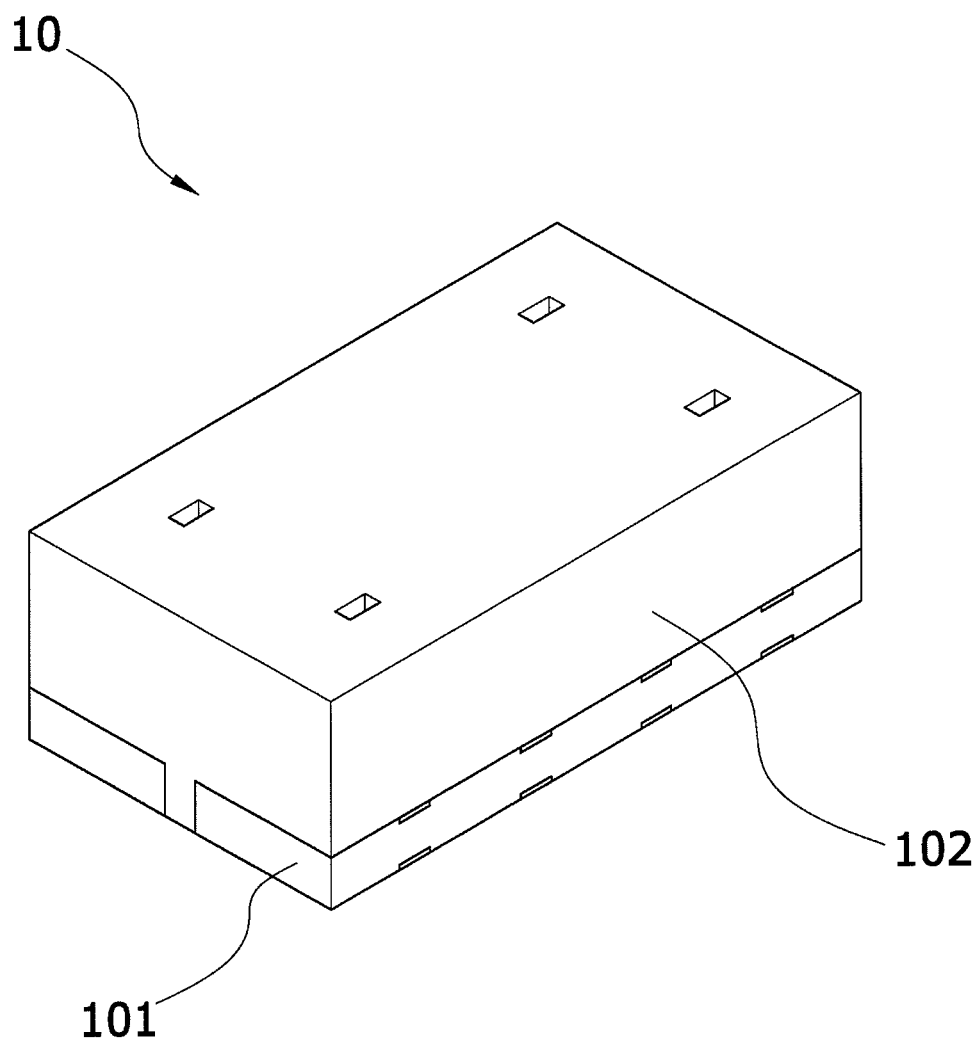
FIG. 5 is a schematic view after completion of the implementation of the utility model.

(3) Injecting adhesive for fixed disposition 23: As described above, referring to FIG. 4, a schematic view (2) of implementation of the utility model is shown, the construction after the assembly of the PCB 101 and the cover 102 is as shown in FIG. 4, and the components or the magnetic element (103 or 104) disposed on the PCB 101 are wrapped by the cover 102 and are located in the accommodation space 1021. At this time, an appearance of the magnetic component 10 of the utility model is slightly in the construction of an integrated circuit. In this step, adhesive 11 is filled into the accommodation space 1021 through the injection portions 1022 formed on the cover 102, so that the components on the PCB 101 are protected by the adhesive 11, and the PCB 101 and the cover 102 can be fixedly disposed due to the filling of the adhesive 11. The construction after the assembly is as shown in FIG. 5, and FIG. 5 is a schematic view after completion of the implementation of the utility model. The adhesive 11 may be epoxy resin or insulation adhesive.

Figure 6:
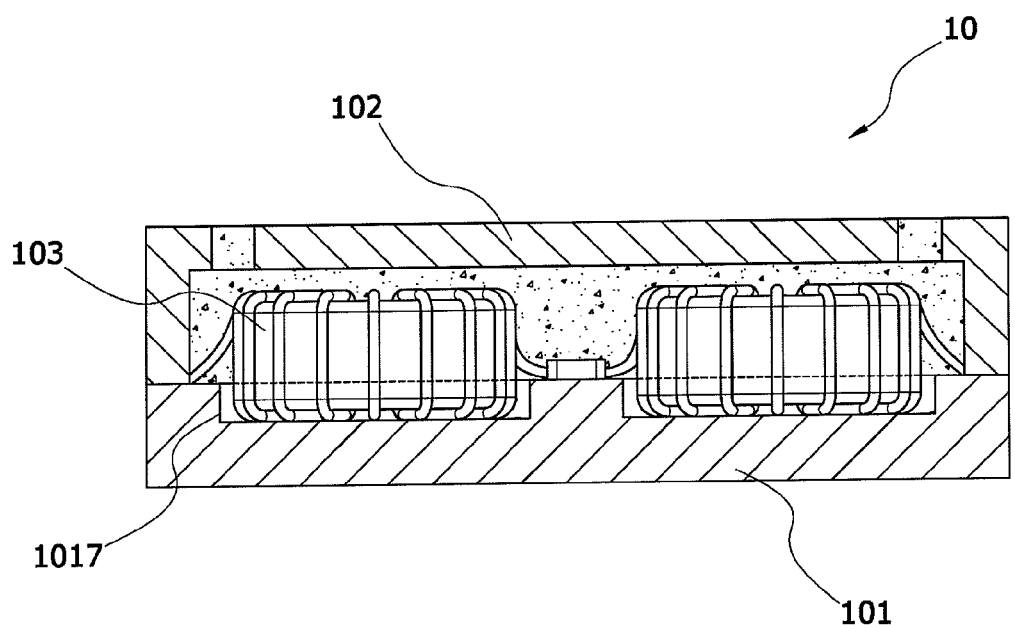
FIG. 6 shows another embodiment (1) of the utility model.
Figure 7:
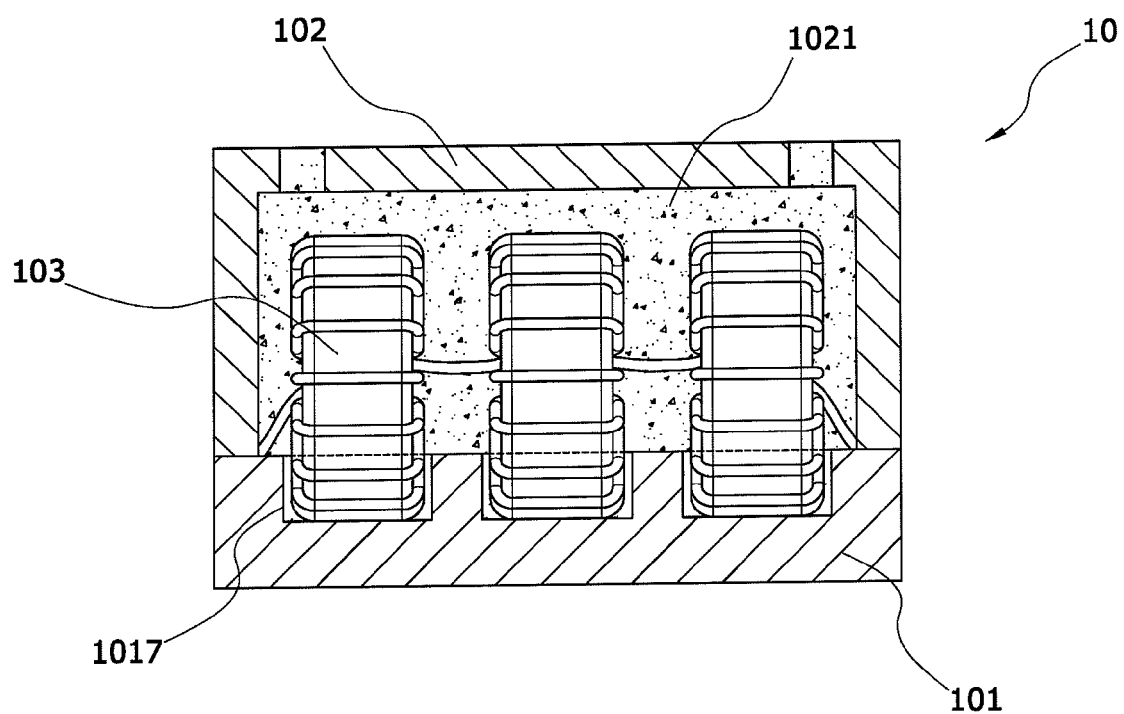
FIG. 7 shows another embodiment (2) of the utility model.

FIG. 6 shows another embodiment (1) of the utility model. More than one accommodation groove 1017 may be formed on a plane of the PCB 101, so as to receive the magnetic element (103 or 104) disposed on the PCB 101. The implementation is as shown in FIG. 6. Moreover, referring to FIG. 7, another embodiment (2) of the utility model is shown, in which, for example, the magnetic element (103 or 104) is disposed in a lying manner. However, during implementation, the magnetic element (103 or 104) may also be disposed in a standing manner in addition to the lying manner, which is not limited thereto. In this way, a design diversity of the magnetic assembly may be increased, and the magnetic assembly is not limited to a single implementation. The accommodation groove 1017 may be formed according to actual requirements to place the magnetic element (103 or 104) of a large size, or may be disposed in a manner different from the lying manner.

Figure 8:
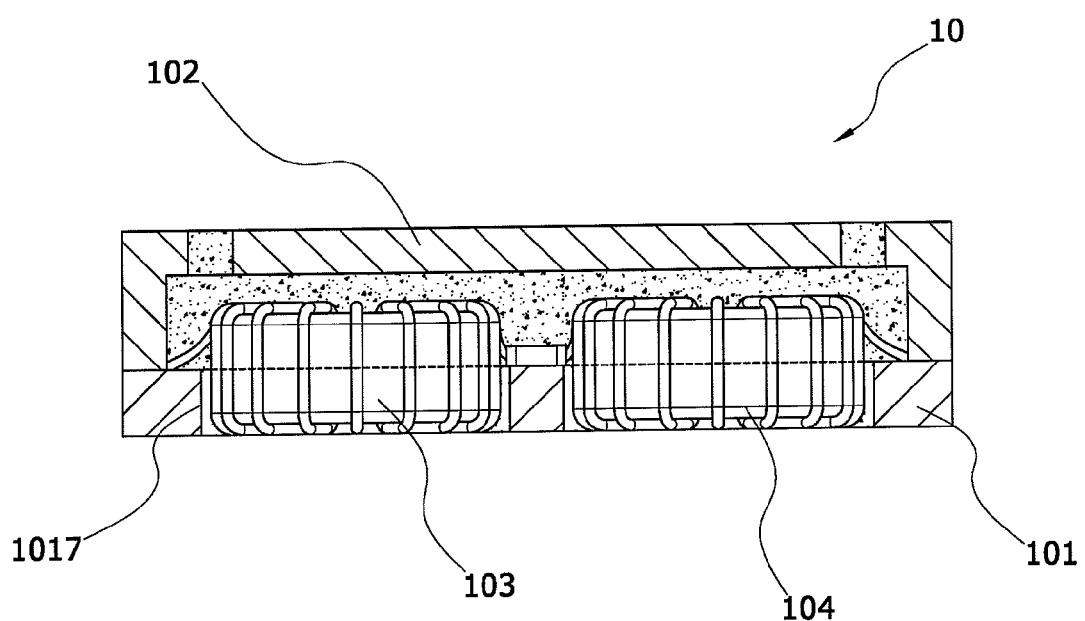
FIG. 8 shows another embodiment (3) of the utility model.
Figure 9:
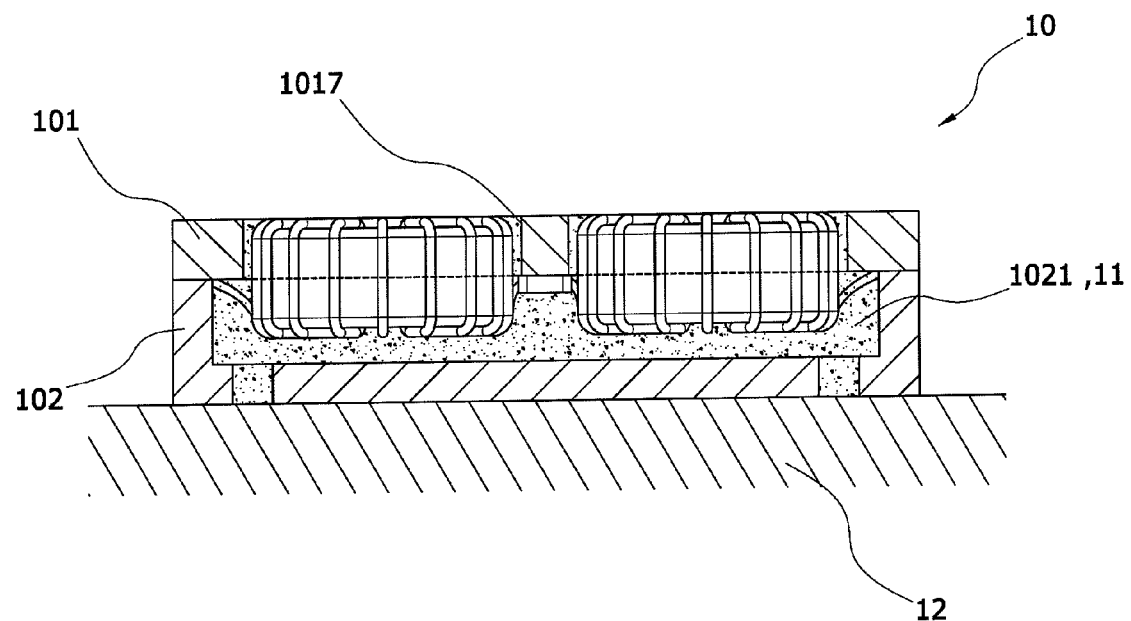
FIG. 9 is a schematic view of implementation of the embodiment (3) of the utility model.

FIG. 8 shows another embodiment (3) of the utility model. In addition to the above implementation of the accommodation groove 1017, the accommodation groove 1017 may be further formed into a through-hole, to place the magnetic element (103 or 104) of different sizes. FIG. 9 is a schematic view of implementation of the embodiment (3) of the utility model. During the assembly, the PCB 101 after the mounting step is assembled with the cover 102, and the two components (101, 102) after the assembly are inverted on a carrying device 12. The construction after the inversion is as shown in FIG. 9. At this time, the filled adhesive 11 of the utility model may be injected into the accommodation space 1021 through the hollow accommodation groove 1017. However, in addition to the implementation method of injecting the adhesive 11 through inversion, in this embodiment, the carrying device 12 may be disposed below the PCB 101, so that one end of the accommodation groove 1017 is temporarily closed, and then, the step of injecting the adhesive 11 is performed, which is not limited thereto.

Figure 10:
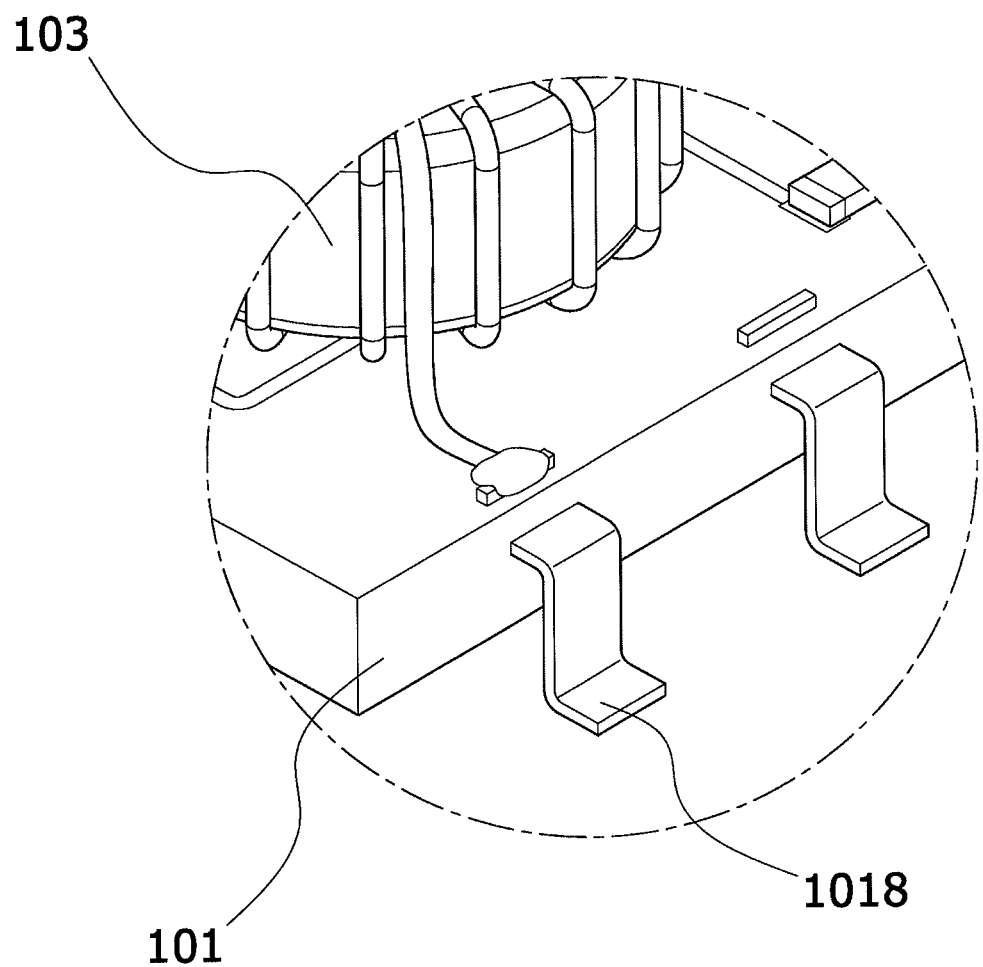
FIG. 10 shows another embodiment (4) of the utility model.

FIG. 10 shows another embodiment (4) of the utility model. In the above embodiments, the first conductive terminal 1013 and the second conductive terminal 1014 are described in the construction of conductive electrodes for example. During implementation, the two conductive terminals (1013, 1014) may produce the same efficacy through an electrical connection member 1018, and the electrical connection member 1018 may also be connected to the electric circuit 1011 on the PCB 101. The construction of the electrical connection member 1018 is as shown in FIG. 10, which is not described in detail herein.

In view of the above, the magnetic assembly of the utility model is formed by a PCB and a cover. A plurality of magnetic elements may be disposed on the PCB, and the magnetic elements are connected to one another through an electric circuit on the PCB. An accommodation space is further formed on the cover for receiving components on the PCB after the assembly of the two components. Moreover, in the construction of the cover and the PCB, the construction of the accommodation space may be adjusted according to the specification of the magnetic elements to be assembled or an accommodation groove is formed. Therefore, due to the design change, the components such as the magnetic elements need to be replaced, causing change of the packaging structure. Accordingly, after the implementation of the utility model, a magnetic assembly capable of adjusting the construction of the packaging casing for adapting to different specifications can be provided.

The above descriptions are merely preferred embodiments of the utility model, but are not intended to limit the utility model. Various modifications and variations made by persons skilled in the art without departing from the spirit of the utility model shall fall within the scope of the utility model.

To sum up, the utility model satisfies the patent requirements of industrial applicability, novelty and inventive step, so that the present application is filed for a utility model patent according to the provisions of the Patent Act.

What is claimed is:

1. A magnetic assembly, comprising:
    a Printed Circuit Board (PCB), disposed with an electric circuit, a through hole, and a conductive material filled in the through hole;
    a first conductive terminal and second conductive terminal separately assembled on an upper end and a lower end of the through hole, the first conductive terminal being electrically connected to the second conductive terminal through the conductive material and the first conductive terminal is connected to the electric circuit, and an end edge of the PCB is formed with an assembling portion;
    a plurality of magnetic elements, respectively disposed on the PCB in a standing manner or a lying manner and electrically connected to the electric circuit and the first conductive terminal; and
    a cover, formed with an accommodation space, wherein a position of the cover corresponding to the assembling portion is respectively formed with a relative assembling portion, wherein after the cover is assembled to the PCB through the assembling portion and the relative assembling portion, adhesive is filled into the accommodation space, so that the cover and the PCB are fixedly disposed.

2. The magnetic assembly according to claim 1, wherein an outer edge of the cover penetrates the accommodation space to form more than one injection portion, so that the adhesive is filled into the accommodation space through the injection portions.

3. The magnetic assembly according to claim 1, wherein more than one accommodation groove is formed on a plane of the PCB.

4. The magnetic assembly according to claim 3, wherein the accommodation groove is in a hollow shape.

5. The magnetic assembly according to claim 3, wherein an electrical passive element is disposed on the PCB.

6. The magnetic assembly according to claim 1, wherein the adhesive is insulation adhesive.

7. The magnetic assembly according to claim 1, wherein the cover is adjustable according to a specification and size of the PCB and the plurality of magnetic elements.

\* \* \* \* \*